United States Patent [19]

Müller et al.

[11] Patent Number: 5,501,778

[45] Date of Patent: Mar. 26, 1996

[54] ORGANIC SUPERCONDUCTOR AND PROCESS FOR PRODUCING THE SAME

[75] Inventors: Harald Müller; Yoshinobu Ueba, both of Osaka, Japan

[73] Assignee: Sumitomo Electric Industries, Ltd., Osaka, Japan

[21] Appl. No.: 61,027

[22] Filed: May 14, 1993

[30] Foreign Application Priority Data

May 19, 1992 [JP] Japan ................................ 4-126350

[51] Int. Cl.$^6$ .................................................. C07B 37/00
[52] U.S. Cl. ............................. 204/157.62; 204/157.15; 204/157.42; 204/157.6
[58] Field of Search ..................... 204/157.15, 157.42, 204/157.6, 157.62; 505/725

[56] References Cited

U.S. PATENT DOCUMENTS

| | | | |
|---|---|---|---|
| 4,657,694 | 4/1987 | Heeger et al. | 252/299.01 |
| 5,114,911 | 5/1992 | Shei et al. | 505/1 |

FOREIGN PATENT DOCUMENTS

| | | | |
|---|---|---|---|
| 0366970 | 5/1990 | European Pat. Off. | |
| 2-270224 | 11/1990 | Japan | H01B 13/00 |

OTHER PUBLICATIONS

Synthetic Metals, vol. 39, pp. 261–267 (1990).
Solid State Communications, vol. 69, No. 8, Feb. 1989, Oxford, GB, pp. 843–845, Schweitzer, et al, "Superconductivity in Polycrystalline Pressed Samples of Organic Metals".
Phase Transistions, vol. 14, No. 1–4, 1989, London, UK, pp. 261–274, Pouget, J. P. et al, "Organic Conductors and Superconductors: A Comparative Survey".
Inorganic Chemistry, vol. 28, No. 1, Jan. 11, 1989, Easton, U.S., pp. 150–154, Beno M. A. et al, "Synthesis of the New Organic Metal $(ET)_2C(CN)_3$ and Characterization of Its Metal–Insulator . . .".

*Primary Examiner*—John Niebling
*Assistant Examiner*—C. Delacroix-Muirheid
*Attorney, Agent, or Firm*—Sughrue, Mion, Zinn, Macpeak & Seas

[57] ABSTRACT

An organic superconductor comprising an electron donor and an electron acceptor and a process for producing the same, the organic superconductor being produced by performing an ultrasonic wave-assisted reaction between the electron donor and the electron acceptor as they are dissolved or dispersed in a solvent in a substantially oxygen-free reaction vessel.

9 Claims, No Drawings

ORGANIC SUPERCONDUCTOR AND PROCESS FOR PRODUCING THE SAME

FIELD OF THE INVENTION

This invention relates to an organic superconductor comprising an electron donor and an electron acceptor. The invention also relates to a process for producing the organic superconductor.

BACKGROUND OF THE INVENTION

There are organic compounds that have been known to exhibit superconductivity at normal pressures. Examples of such organic compounds include bis(ethylenedithio)tetrathiafulvalene (BEDT-TTF) compounds, as described in JP-A-61-277691, dimethyl(ethylenedithio)diselenadithiafulvalene (DMET) compounds, as described in JP-A-63-246383, and methylenedithiotetrathiafulvalene (MDT-TTF) compounds reported by G. C. Papauassiliou et al. in the International Conference on Science and Technology of Synthetic Metals, Jun. 26–Jul. 2, 1988, Santa Fe. (The term "JP-A" as used herein means an unexamined published Japanese patent application.)

It is also known that cationic radical salts such as (BEDT-TTF)$_2$Cu(NCS)$_2$ and the deuteride thereof (BEDT-TTFd$_8$)$_2$Cu(NCS)$_2$ have critical temperatures (Tc) of 10K and more, as described in H. Urayama et al., Chem. Lett., p. 55 (1988).

These organic superconductors are generally produced by an electrolytic crystal growth method. According to this method, an electron donor such as BEDT-TTF and an electron acceptor such as $I_3^-$ or Cu(NCS)$_2^-$ or raw materials therefor are dissolved in a suitable solvent to form an electrolytic solution and, using a Pt electrode and the like, a direct current is permitted to flow through the electrolytic solution so that the electron donor and the electron acceptor undergo an electrolytic redox reaction to produce an organic superconductor as a crystalline charge transfer complex.

However, the electrolytic crystal growth method has a problem in that an extremely long time is needed to produce an organic superconductor although it depends on the reaction temperature, current value and other conditions. For example, in the case of producing an organic superconductor from a solution of 30 mg of an electron donor in 180 ml of a solvent by performing electrolytic crystal growth at a reaction temperature of 20° C. with a current at 1 µA, it takes from several days to several weeks to produce 5 to 10 mg of the desired crystal, as described in JP-A-2-270224.

As a further problem, the yield of the product based on the starting materials is very low, and this fact, combined with the long time required for completing the process, makes the electrolytic crystal growth method unsuitable for use in large-scale production of organic superconductors.

H. Müller, one of the inventors of the present invention, has made an attempt at oxidizing BEDT-TTF with Cu(NCS)$_2$ in a solution to synthesize (BEDT-TTF)$_2$Cu(NCS)$_2$ in a short time and successfully produced the intended superconductor having Tc of 8.8K by stirring an acetonitrile solution of BEDT-TTF and Cu(NCS)$_2$ for 1 hour with heating at the boiling point of the solvent acetonitrile (as described in *Synthetic Metals*, vol. 39, pages 261–267 (1990)). However, this method requires heating and, in addition, the solubility of the starting materials in the solvent is low and the yield of the reaction product has not been necessarily satisfactory.

The present invention has been accomplished under these circumstances.

SUMMARY OF THE INVENTION

An object of the present invention is to provide an organic superconductor that can be produced in a shorter time and with a higher yield.

Another object of the present invention is to provide a process for producing an organic superconductor in a shorter time with a higher yield.

Other objects and effects of the present invention will be apparent from the following description.

The present inventors have conducted various studies on a source of energy for the reaction that can be substituted for heating; and as a result, they found that organic superconductors can be produced from electron donors and electron acceptors by treatment with ultrasonic waves. The present invention has been accomplished on the basis of this finding.

The present invention relates to an organic superconductor comprising an electron donor and an electron acceptor, which is produced by performing an ultrasonic-wave assisted reaction between the electron donor and the electron acceptor as they are dissolved or dispersed in a solvent in a substantially oxygen-free reaction vessel.

The present invention also relates to a process for producing an organic superconductor comprising the steps of: dissolving or dispersing an electron donor and an electron acceptor in a solvent in a substantially oxygen-free reaction vessel; and then performing a treatment with ultrasonic waves to have the electron donor react with the electron acceptor.

DETAILED DESCRIPTION OF THE INVENTION

According to the process of the present invention, organic superconductors can be produced at relatively lower temperatures than have been necessary in the conventional method with heating. In addition, large amount of organic superconductors can be produced within extremely shorter periods than have been necessary for the electrolytic crystal growth method. Furthermore, no serious problem occurs even if the solubility of the starting materials in the solvent is low, because ultrasonic vibrations helps the starting materials disperse uniformly in the solvent and, hence, organic superconductors can be manufactured with a higher yield than when the method with heating or the electrolytic crystal growth method is used. Therefore, this feature of the process of the present invention, as combined with its simplicity, enables the large scale production of organic superconductors which has been heretofore impossible.

As a further advantage, the organic superconductor of the present invention can be produced by the process of the present invention within a shorter time with higher yield, and therefore, compared to those which are manufactured by the prior art method, the organic superconductors of the present invention are economically advantageous and available at low cost.

Furthermore, since the organic superconductors of the present invention are produced under vibration caused by the application of ultrasonic waves, they are in the form of microcrystalline powder and can be processed into various shapes such as wires, sheets, plates, pipes, disks, etc. Hence, the organic superconductors of the present invention have high potential to be used in various fields as exemplified by superconducting wires, superconducting coils, magnetic shields, magnetic bearings, etc.

One embodiment of the process of the present invention is described below in detail, but the present invention is not construed as being limited thereto.

Predetermined amounts of two starting materials, an electron donor and an electron acceptor, are first charged into a reaction vessel.

Examples of the electron donor include sulfurcontaining compounds such as BEDT-TTF, MDT-TTF, tetrathiafulvalene (TTF), tetramethyltetrathiafulvalene (TMTTF), bis(2,3-butylenedithio)tetrathiafulvalene (BBDS-TTF), bis(1,2-propylenedithio)tetrathiafulvalene, 2,3-butylenedithia(ethylenedithio)tetrathiafulvalene and 1,2-propylenedithia(ethylenedithio)tetrathiafulvalene; compounds that are the same as listed above, except that part or all of the sulfur atoms contained therein are replaced by selenium, tellurium or oxygen, as exemplified by DMET, tetraselenafulvalene (TSeF), tetramethyltetraselenafulvalene (TMTSF), tetratellurafulvalene (TTeF), bis(ethylenediselena)tetrathiafulvalene (BEDSe-TTF), bis(ethylenediselena)tetraselenafulvalene (BEDSe-TSeF), bis(ethylenedithio)tetraselenafulvalene (BEDT-TSeF), bis(propylenediselena)tetrathiafulvalene (BPDSe-TTF), bis(2,3-butylenediselena)tetrathiafulvalene (BBDSe-TTF) and bis(ethylenedioxy)tetrathiafulvalene (BEDO-TTF); and tetraaminoanthraquinone (TAAQ), etc. Examples of the electron donors also include compounds that are the same as listed above, except that part or all of the atoms contained therein are replaced by their isotopes (e.g., hydrogen is replaced by deuterium). Among the compounds listed above, BEDT-TTF, TMTSF, DMET and MDT-TTF are preferred, and BEDT-TTF is the most preferred as the electron donor.

Examples of the electron acceptors include a trihalide, e.g., $I_3^-$, $IBr_2^-$, $Br_3^-$; a metal halide, e.g., $AuI_2^-$, $AuCl_2^-$, $AuBr_2^-$, $HgCl_2^-$, $HgBr_2^-$, $HgI_2^-$, $HgBr_8^-$, $Hg_3Br_8^-$; a metal cyanate, e.g., $Au(CN)_2^-$, $Hg(CN)_2^-$, $KHg(NCS)_4^-$; a metal thiocyanate, e.g., $Cu(NCS)_2^-$, $Cd(NCS)_2^-$, $Zn(NCS)_2^-$, $Hg(NCS)_2^-$, $KHg(NCS)_2^-$; a metal halogendicyaneamide, e.g., $Cu[N(CN)_2]X^-$ (where X represents a halogen atom, e.g., Br, Cl, etc.); a fluoride, e.g., $PF_6^-$, $AsF_6^-$, $SbF_6^-$, $TaF_6^-$; a metal dimercaptoisotrithione complex, e.g., $Ni(dmit)_2^-$, $Pd(dmit)_2^-$ (where dmit represents dimercaptoisotrithione); and others such as $(I_3^-)_{1-a}(AuI_2^-)_a$ (where a represents a positive number smaller than 1), $ClO_4^-$, $ReO_4^-$, and $FSO_3^-$. Among these ions, $I_3^-$, $Cu(NCS)_2^-$ and $Cu[N(CN)_2]X^-$ may be used most advantageously as electron acceptors.

Examples of the organic superconductors of the present invention include β-(BEDT-TTF)$_2$I$_3$ (Tc=8K), κ-(BEDT-TTF)$_2$Cu(NCS)$_2$ (Tc=11K), (BEDT-TTF)$_2$Cu[N(CN)$_2$]X (where X represents a halogen atom, e.g., Br, Cl, etc.) (Tc=13K), etc.

The amount ratio of the electron donor and the electron acceptor can be determined stoichiometrically. For example, to produce β-(BEDT-TTF)$_2$I$_3$, BEDT-TTF and I$_2$ (as the raw material of I$_3^-$) are charged in a reaction vessel at a molar ratio of 2/1.5; and to produce κ-(BEDT-TTF)$_2$Cu(NCS)$_2$, BEDT-TTF and Cu(NCS)$_2$ are charged in a reaction vessel at a molar ratio of 2/1.

The reaction vessel is not particularly limited and may be of any type equipped with a stirrer, a cooling pipe, a gas purge port, inlets for feeding raw materials, etc.

After charging the starting materials, the air in the reaction vessel is vacuum extracted and an inert gas such as nitrogen or argon is supplied into the vessel. This procedure is repeated several times until the interior of the vessel becomes substantially free of oxygen.

A solvent that has been freed of dissolved oxygen by a suitable method such as bubbling an inert gas or freeze deaeration is next charged into the reaction vessel, and the contents are stirred to have the electron donor and electron acceptor dissolved or dispersed in the solvent. One or both of the electron donor and the electron acceptor may entirely or partly be left undissolved in the solvent. Undissolved starting materials are dispersed uniformly in the solvent when subjected to ultrasonic vibrations in the subsequent treatment with ultrasonic waves.

Examples of the solvents include 1,1,2-trichloroethane, tetrahydrofuran, 1,2-dichloroethane, dichloromethane, chlorobenzene, fluorobenzene, anisole, acetonitrile, benzonitrile, etc. Among these, tetrahydrofuran, benzonitrile, and acetonitrile are preferably used. The solvent is preferably used after thoroughly being freed of water and oxygen.

The amount of the solvent is not particularly limited, and is generally used in such an amount that the electron donor and the electron acceptor are sufficiently dispersed therein. The amount of the solvent is preferably from several percent by weight to about 80% by weight based on the amount of the electron donor and the electron acceptor.

The reaction solution thus prepared is then treated with ultrasonic waves, whereupon the electron donor reacts with the electron acceptor to give a reaction product that is precipitated as a powder in the reaction solution. The reaction product is filtered, washed with a solvent and dried to yield the organic superconductor of the present invention in a microcrystalline powder form. Examples of the solvent for washing include diethyl ether and n-hexane, as well as the above-mentioned solvents for ultrasonic treatment. Preferably, the reaction product is washed several times with a solvent used for ultrasonic treatment and then washed with diethyl ether and the like.

The ultrasonic treatment may be performed with any ordinary ultrasonic wave generator. The temperature for the ultrasonic treatment is not particularly limited, and room temperature or temperatures in its neighborhood will suffice to produce the intended superconductor within a short time in a high yield. If desired, the reaction solution may be heated during the ultrasonic treatment and this will further shorten the reaction time, with a further improvement in the yield of the reaction product. Heating is preferably performed up to a temperature not exceeding 150° C. or about the boiling point of the solvent used. The oscillation frequency and the power output of the ultrasonic wave generator are not particularly limited and preferably from 30 to 50 KHz and 50 to 300 W, respectively. By increasing the power output, the time required for the ultrasonic treatment can generally be shortened.

The time for which the ultrasonic treatment is performed can be determined as appropriate for the specific reaction conditions including the types of starting materials and solvent used and the reaction temperature.

The organic superconductor produced by the method described above can be processed, either independently or together with a suitable binder, into various shapes such as wires, sheets, plates, pipes and disks for use in various fields as superconducting wires, superconducting coils, magnetic shields, magnetic bearings, etc.

The present invention will be described in more detail by referring to the following examples, but the present invention is not construed as being limited thereto.

EXAMPLE

BEDT-TTF (30 mg, $7.8 \times 10^{-5}$ mol) and Cu(NCS)$_2$ (7.0 mg, $3.9 \times 10^{-5}$ mol) were charged into a flask that had been thoroughly deaerated and purged with argon. After further three additional cycles of deaeration and argon purge, 30 ml of tetrahydrofuran dried to a water content of less than 0.1% was added and the flask was sealed.

The flask was then immersed in the water-filled cavity of an ultrasonic wave generator (BRANSON YAMATO 1200, made by BRANSON, oscillation frequency: 45 KHz, power output: 60 W) and subjected to an ultrasonic treatment at room temperature for 30 minutes, whereupon a dark brown precipitate formed in the reaction solution that turned slightly green.

The precipitate was filtered, washed three times with 5 ml of tetrahydrofuran, then twice with 10 ml of diethyl ether, and vacuum dried on diphosphorus pentoxide, giving dark brown powder in an amount of 27.8 mg (yield: 77.6%).

Examination under a scanning electron microscope showed that the dark brown powder was microcrystalline having a shape of slender hexagonal plates 5 to 10 µm long and not thicker than 1 µm.

Elemental analysis of the powder showed that it was composed of 27.19% C, 1.35% H and 3.20% N, which results were in substantial agreement with the calculated values for $(BEDT-TTF)_2Cu(NCS)_2$: 27.8% C, 1.69% H, and 2.95% N.

An infrared spectroscopy of the powder gave absorption peaks at 2,150 $cm^{-1}$ (w), 1,331 $cm^{-1}$ (m), 1,253 $cm^{-1}$ (s), 1,156.5 $cm^{-1}$ (m), 876.4 $cm^{-1}$ (m) and 456 $cm^{-1}$ (m). These peaks were in agreement with the absorption peaks for $(BEDT-TTF)_2Cu(NCS)_2$.

The magnetization of the powder was measured with a DC SQUID (HS-SM 2000 SQUID Magnetometer, made by Hoxan Co.) and it exhibited superconductivity at Tc of 10K±1K. The powder was therefore identified as $(BEDT-TTF)_2Cu(NCS)_2$.

As described above in detail, the organic superconductor of the present invention can be produced by the process of the present invention in a shorter time with higher yield and, hence, it is economically more advantageous and available at lower cost than what has been produced by the prior art method. Furthermore, since the organic superconductor of the present invention is produced under vibrations caused by the application of ultrasonic waves, it is in the form of a microcrystalline powder and can be processed into various shapes such as wires, sheets, plates, pipes, disks, etc. Hence, the organic superconductor of the present invention has the high potential to be used in various fields as exemplified by superconducting wires, superconducting coils, magnetic shields, magnetic bearings, etc.

The process of the present invention permits this organic superconductor to be manufactured in a shorter time with higher yield and this feature of the process, as combined with its simplicity, enables the large scale production of organic superconductors which has been heretofore impossible.

While the invention has been described in detail and with reference to specific examples thereof, it will be apparent to one skilled in the art that various changes and modifications can be made therein without departing from the spirit and scope thereof.

What is claimed is:

1. An organic superconductor comprising an electron donor and an electron acceptor, wherein said electron donor is tetrathiafulvalene, and said electron acceptor is selected from the group consisting of $I_3^-$, $Cu(NSC)_2^-$, and $Cu[N(CN)_2]X^-$, wherein X represents a halogen atom; and wherein said organic surperconductor comprises a microcrystalline powder, said organic superconductor being produced by performing an ultrasonic wave-assisted reaction between said electron donor and said electron acceptor as they are dissolved or dispersed in a solvent in a substantially oxygen-free reaction vessel.

2. An organic superconductor as claimed in claim 1, wherein said electron donor is bis(ethylenedithio)tetrathiafulvalene.

3. An organic superconductor as claimed in claim 1, wherein said electron donor is bis(ethylenedithio)tetrathiafulvalene, and said electron acceptor is $I_3^-$.

4. An organic superconductor as claimed in claim 3, wherein the ratio of bis(ethylenedithio)tetrathiafulvalene, to $I_3^-$ is 2/1.5.

5. An organic superconductor as claimed in claim 3, wherein the ratio of bis(ethylendedithio)tetrathiafulvalene, to $Cu(NSC)_2^-$ is 2/1.

6. An organic superconductor as claimed in claim 1, wherein said electron donor is bis(ethylenedithio)tetrathiafulvalene, and said electron acceptor is $Cu(NSC)_2^-$.

7. A process for producing an organic superconductor comprising the steps of: dissolving or dispersing an electron donor, wherein said electron donor is tetrathiafulvalene, and an electron acceptor, wherein said electron acceptor is selected from the group consisting of $I_3^-$, $Cu(NSC)_2^-$, and $Cu[N(CN)_2]X^-$, wherein X represents a halogen atom in a solvent in a substantially oxygen-free reaction vessel; and then performing a treatment with ultrasonic waves to react said electron donor with said electron acceptor.

8. A process for producing an organic super conductor as claimed in claim 7, wherein said ultrasonic treatment is performed at a temperature not higher than the boiling point of said solvent or not higher than 150° C.

9. An organic superconductor comprising an electron donor and an electron acceptor, wherein said organic superconductor comprises a microcrystalline powder having a shape of slender hexagonal plates 5 to 10 µm long and not thicker than 1 µm; said organic superconductor being produced by performing an ultrasonic wave-assisted reaction between said electron donor and said electron acceptor as they are dissolved or dispersed in a solvent in a substantially oxygen-free reaction vessel.

* * * * *